United States Patent
Heo et al.

(10) Patent No.: US 11,586,352 B2
(45) Date of Patent: Feb. 21, 2023

(54) METHOD FOR SETTING LAYOUT FOR PHYSICAL KEYBOARD BY ELECTRONIC DEVICE, AND DEVICE THEREFOR

(71) Applicant: Samsung Electronics Co., Ltd., Suwon-si (KR)

(72) Inventors: Jiyoon Heo, Suwon-si (KR); Myojin Bang, Suwon-si (KR); Minjeong Moon, Suwon-si (KR); Minjung Moon, Suwon-si (KR); Seoyoung Yoon, Suwon-si (KR); Hayoung Jeon, Suwon-si (KR); Jaegi Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/256,601

(22) PCT Filed: Jul. 1, 2019

(86) PCT No.: PCT/KR2019/007978
§ 371 (c)(1),
(2) Date: Dec. 28, 2020

(87) PCT Pub. No.: WO2020/005044
PCT Pub. Date: Jan. 2, 2020

(65) Prior Publication Data
US 2021/0271386 A1 Sep. 2, 2021

(30) Foreign Application Priority Data
Jun. 29, 2018 (KR) .................. 10-2018-0075610

(51) Int. Cl.
*G06F 3/04895* (2022.01)
*G06F 9/451* (2018.01)
(Continued)

(52) U.S. Cl.
CPC ........ *G06F 3/04895* (2013.01); *G06F 1/1669* (2013.01); *G06F 3/0238* (2013.01); *G06F 9/453* (2018.02); *H03M 11/20* (2013.01)

(58) Field of Classification Search
CPC ...... G06F 3/0238; G06F 3/018; G06F 3/0233; G06F 3/04842; G06F 3/04886;
(Continued)

(56) References Cited

U.S. PATENT DOCUMENTS 9,529,449 B1 * 12/2016 Chen ..................... G06F 3/0233
2007/0229463 A1 * 10/2007 Tsukamoto ........ H04N 1/00498
345/172

(Continued)

FOREIGN PATENT DOCUMENTS

JP 2013-211703 A 10/2013
KR 10-2009-0023041 A 3/2009
(Continued)

OTHER PUBLICATIONS

International Search Report dated Oct. 31, 2019 in connection with International Patent Application No. PCT/KR2019/007978, 2 pages.
(Continued)

*Primary Examiner* — Rayeez R Chowdhury

(57) ABSTRACT

Various embodiments of the present invention relate to a method for setting a layout for a physical keyboard by an electronic device to which same is connected, and a device therefor. An electronic device according to various embodiments of the present invention may comprise a display, a communication interface, a memory, and a processor, wherein the processor includes the functions of: sensing, through the communication interface, whether an external device is connected; displaying guide text related to keyboard layout configurations by means of the display on the basis of the function of sensing whether the external device
(Continued)

is connected; receiving a key value input by a user through the external device; searching for a layout corresponding to the received key value; and setting the found layout as a keyboard layout for the connected external device. Various embodiments are possible.

15 Claims, 16 Drawing Sheets

(51) Int. Cl.
*G06F 1/16* (2006.01)
*G06F 3/023* (2006.01)
*H03M 11/20* (2006.01)

(58) Field of Classification Search
CPC .... G06F 3/0489; G06F 3/0219; G06F 3/0236; G06F 3/04895; G06F 40/129; G06F 40/232; G06F 16/55; G06F 1/1669; G06F 3/04855; G06F 3/0488; G06F 9/453; G06F 21/34; G06F 3/0426; G06F 21/31; G06F 21/45; G06F 3/011; G06F 40/58; G06F 16/9577; G06F 3/016; G06F 3/04883; G06F 16/957; G06F 21/6218; G06F 21/6245; G06F 21/629; G06F 21/83; G06F 2200/1634; G06F 2203/011; G06F 2203/04809; G06F 2221/2105; G06F 3/0393; G06F 3/041; G06F 3/0481
See application file for complete search history.

(56) References Cited

U.S. PATENT DOCUMENTS

| | | | |
|---|---|---|---|
| 2009/0187687 A1* | 7/2009 | Hulbert | G06F 9/4415 710/73 |
| 2009/0195506 A1 | 8/2009 | Geidl et al. | |
| 2009/0235165 A1 | 9/2009 | Fux et al. | |
| 2010/0125725 A1 | 5/2010 | Akrout et al. | |
| 2011/0179372 A1* | 7/2011 | Moore | G06F 3/0237 715/810 |
| 2012/0173982 A1* | 7/2012 | Herz | G06F 3/04847 715/830 |
| 2013/0191772 A1 | 7/2013 | Hwang | |
| 2014/0035823 A1* | 2/2014 | Khoe | G06F 3/04886 345/171 |
| 2015/0317075 A1 | 11/2015 | Sun | |

FOREIGN PATENT DOCUMENTS

| | | |
|---|---|---|
| KR | 10-2010-0102191 A | 9/2010 |
| KR | 10-2012-0048966 A | 5/2012 |
| KR | 10-2013-0083195 A | 7/2013 |
| KR | 10-2015-0034138 A | 4/2015 |
| WO | 2017/091411 A1 | 6/2017 |

OTHER PUBLICATIONS

Written Opinion of the International Searching Authority dated Oct. 31, 2019 in connection with International Patent Application No. PCT/KR2019/007978, 5 pages.

Office Action dated Oct. 28, 2022 in connection with Korean Patent Application No. 10-2018-0075610, 13 pages.

* cited by examiner

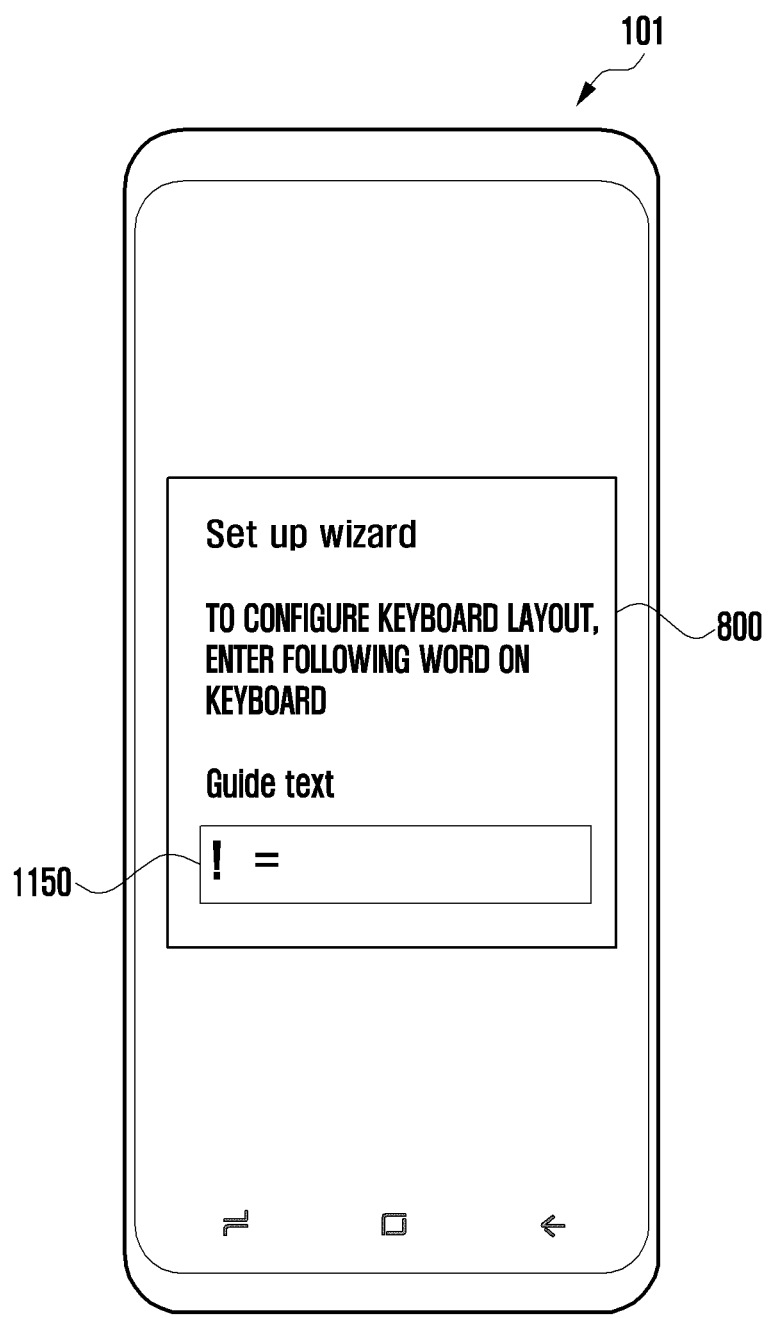

METHOD FOR SETTING LAYOUT FOR PHYSICAL KEYBOARD BY ELECTRONIC DEVICE, AND DEVICE THEREFOR

CROSS-REFERENCE TO RELATED APPLICATIONS

This application is a 371 of International Application No. PCT/KR2019/007978 filed on Jul. 1, 2019, which claims priority to Korean Patent Application No. 10-2018-0075610 filed on Jun. 29, 2018, the disclosures of which are herein incorporated by reference in their entirety.

BACKGROUND

1. Field

Various embodiments relate to a method and a device for automatically configuring a layout of a connected physical keyboard (or hardware keyboard) in an electronic device.

2. Description of Related Art

With the development of digital technology, various types of electronic devices, such as a mobile communication terminal, a smartphone, a tablet personal computer (PC), a notebook, a personal digital assistant (PDA), a wearable device, or a digital camera, are widely used.

Updated electronic devices are configured to include a touch panel (or touchscreen) and support touch-based input using a touch panel. For example, a user may manipulate objects through touch-based input on the surface of a display of an electronic device.

Recently, electronic devices connectable with a physical keyboard have been released according to demands from users accustomed to a physical keyboard. For example, to increase convenience in text input (or manipulation of an electronic device) in an electronic device, an electronic device is connected with a physical keyboard (or hardware keyboard), thereby enabling user input by an external device.

When a physical keyboard is connected to an electronic device, a user may directly configure a keyboard layout of the physical keyboard connected to the electronic device and may perform input to the electronic device using the connected physical keyboard after completing the configuration process. For example, a physical keyboard generally used today may have various layouts imprinted (or printed) depending on countries, languages, or keyboard types. However, the electronic device cannot determine a layout of the connected physical keyboard, and the user needs to directly configure a layout of the physical keyboard in order to use the keyboard due to such a constraint.

A method for a user to configure a layout of a physical keyboard in an electronic device may include a method in which the user directly selects and configures one keyboard layout from a given layout configuration list or a method in which a layout of a physical keyboard is randomly allocated and configured on the basis of a virtual keyboard layout configured in an electronic device.

In the former method, a physical keyboard may have a plurality of layouts within the same language group (or country), making it difficult for the user to cognitively distinguish the layouts. In the latter method, when a physical keyboard having a keyboard layout different from the virtual keyboard layout as a reference is connected, the layout actually imprinted on the physical keyboard may not be reflected. For example, when a physical keyboard has a Canadian-French layout, the user may not accurately recognize the layout and may thus configure a wrong keyboard layout, such as a French layout. In another example, when a virtual keyboard has a US English layout, a US English layout of a physical keyboard may include, for example, various types (e.g., US-English (or QWERTY), US-Colemak, US-Dvorak, and the like), thus making it difficult to allocate an accurate layout according to user intent. In another example, when the virtual keyboard has a German layout and the user uses the electronic device in the USA, the physical keyboard may have one of various types of US English layouts, thus configuring an inaccurate layout or making it impossible to use the connected physical keyboard.

Conventionally, since there are a variety of layouts for each language (or country) and a plurality of layouts may exist even within a single language (or country), it may be difficult for a user to cognitively configure a keyboard layout. Further, when a layout of a physical keyboard is configured to correspond to a layout of a virtual keyboard, a layout actually imprinted on the physical keyboard cannot be reflected. Conventionally, a complex procedure, for example, entering a keyboard configuration menu, selecting a keyboard item, selecting a language group (or country), selecting a layout, and the like, is required in order to configure a layout of a physical keyboard. When a plurality of layouts exists in the same language group (or country), an incorrect layout may be selected in the final layout selection process or a user may have difficulty in selecting the layout.

Various embodiments disclose a method for easily and simply configuring a layout imprinted (or printed) on a physical keyboard in an electronic device when the physical keyboard is connected to the electronic device, and an electronic device therefor.

Various embodiments disclose a method for supporting configuring an accurate layout of a physical keyboard even when a user does not recognize accurate information (e.g., name or layout) about the keyboard layout of the physical keyboard connected to an electronic device, and an electronic device therefor.

Various embodiments disclose a method for automatically configuring a keyboard layout matched with a key value input from a physical keyboard when guide text is input through the physical keyboard connected to an electronic device, and an electronic device therefor.

Various embodiments disclose a method for inferring and confirming a layout of a physical keyboard by providing guide text through a display of an electronic device and determining the key value and position (coordinates) of a key corresponding to the guide text input through the physical keyboard when the physical keyboard is connected to an electronic device, and an electronic device therefor.

SUMMARY

An electronic device according to various embodiments of the disclosure may include: a display; a communication interface; a memory; and a processor, wherein the processor may detect connection of an external device through the communication interface, may display guide text associated with configuration of a keyboard layout on the display upon detecting the connection of the external device, may receive a key value input by a user through the external device, may retrieve a layout corresponding to the received key value, and may configure the retrieved layout as a keyboard layout for the connected external device.

An operating method of an electronic device according to various embodiments of the disclosure may include: detecting connection of an external device through a communication interface; displaying guide text associated with configuration of a keyboard layout on a display upon detecting the connection of the external device; receiving a key value input by a user through the external device; retrieving a layout corresponding to the received key value; and configuring the retrieved layout as a keyboard layout for the connected external device.

To achieve the foregoing aspects, various embodiments of the disclosure may include a computer-readable recording medium recording a program to execute the method by a processor.

According to an electronic device and an operating method thereof in accordance with various embodiments, when connecting a physical keyboard to an electronic device, a user may easily configure a layout corresponding to a layout imprinted (or printed) on the physical keyboard. According to various embodiments, the user can accurately configure the layout of the physical keyboard even when not recognizing accurate information (e.g., name or layout) about the keyboard layout of the physical keyboard connected to the electronic device. According to various embodiments, even in the absence of layout information about the physical keyboard, the user may configure (or reflect) the actual layout imprinted on the physical keyboard through an easy, simple, and intuitive configuration process. According to various embodiments, use of the electronic device connected with the physical keyboard may enhance the user's utilization and convenience.

BRIEF DESCRIPTION OF THE DRAWINGS

FIG. 11 illustrates an example of a screen displayed by an electronic device according to various embodiments.

DETAILED DESCRIPTION

Figure 1:
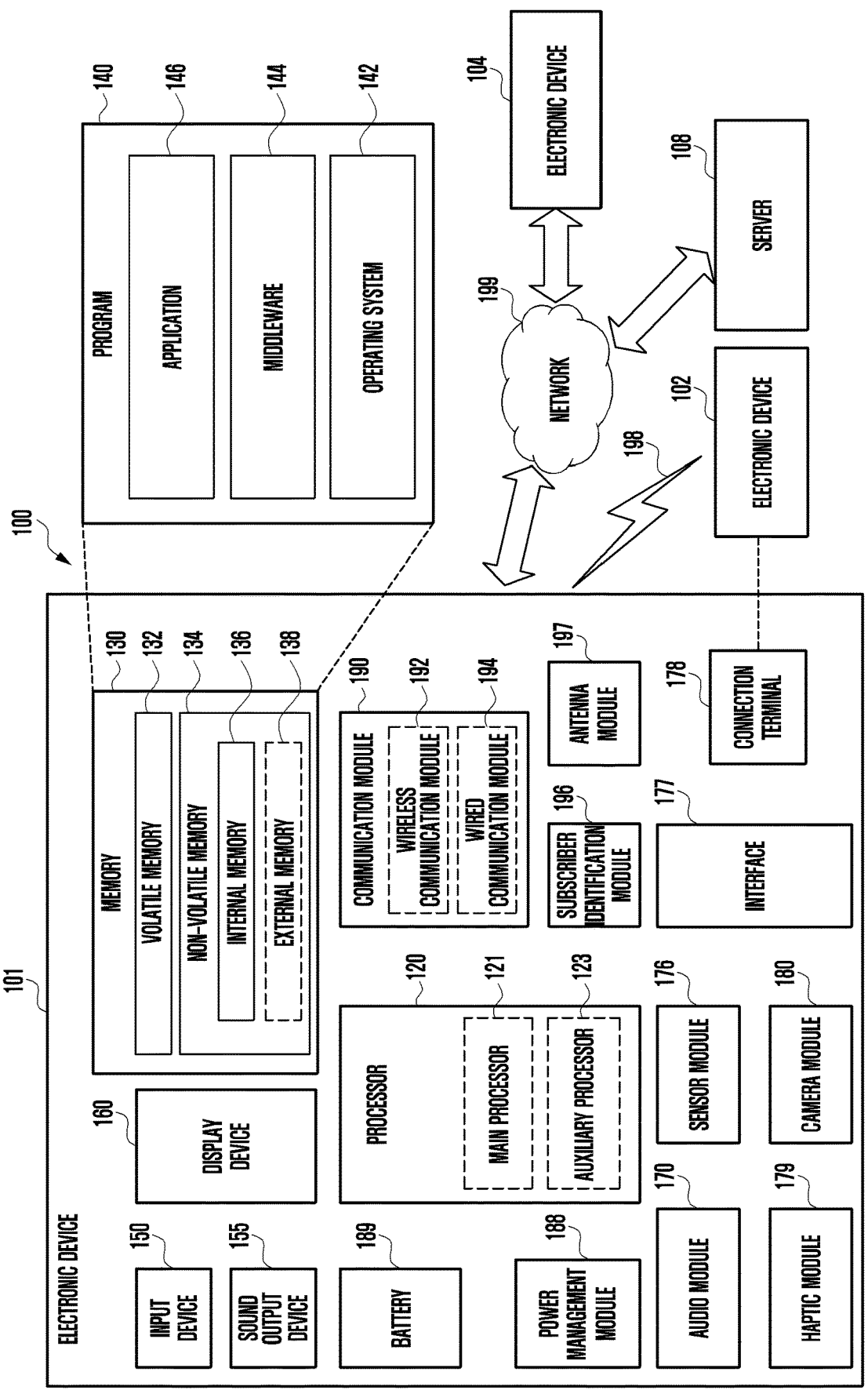
FIG. 1 illustrates an electronic device in a network environment according to an embodiment.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), with an electronic device 104 or a server 108 via a second network 199 (e.g., a long-range wireless communication network), or with the electronic device 104 via the server 108, and may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. The processor 120 may load a command or data received from another component (e.g., the sensor module 176 or the communication module 190) in the volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101 and may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by another component (e.g., the processor 120) of the electronic device 101, from the outside (e.g., a user) of the electronic device 101, and may include a microphone, a mouse, a keyboard, or a digital pen (e.g., a stylus pen).

The sound output device 155 may output sound signals to the outside of the electronic device 101 and may include a speaker or a receiver. The speaker may be used for general purposes, such as playing multimedia or playing record, and the receiver may be used for incoming calls and may be implemented as separate from, or as part of the speaker.

The display device 160 may visually provide information to the outside (e.g., a user) of the electronic device 101 and may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa, and may obtain the sound via the input device 150, or output the sound via the sound output device 155 or a headphone of an external electronic device (e.g., an electronic device 102) directly (e.g., over wires) or wirelessly coupled with the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state, and may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., over wires) or wirelessly, and may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), and may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation, and may include a motor, a piezoelectric element, or an electric stimulator.

The camera module 180 may capture a still image or moving images and may include one or more lenses, image sensors, image signal processors, or flashes.

The power management module 188 may manage power supplied to the electronic device 101, and may be implemented as at least part of a power management integrated circuit (PMIC).

The battery 189 may supply power to at least one component of the electronic device 101, and may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101 and may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., an RFIC) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101.

All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing, as at least part of a reply to the request. To that end, a cloud, distributed, or client-server computing technology may be used, for example.

Figure 2:
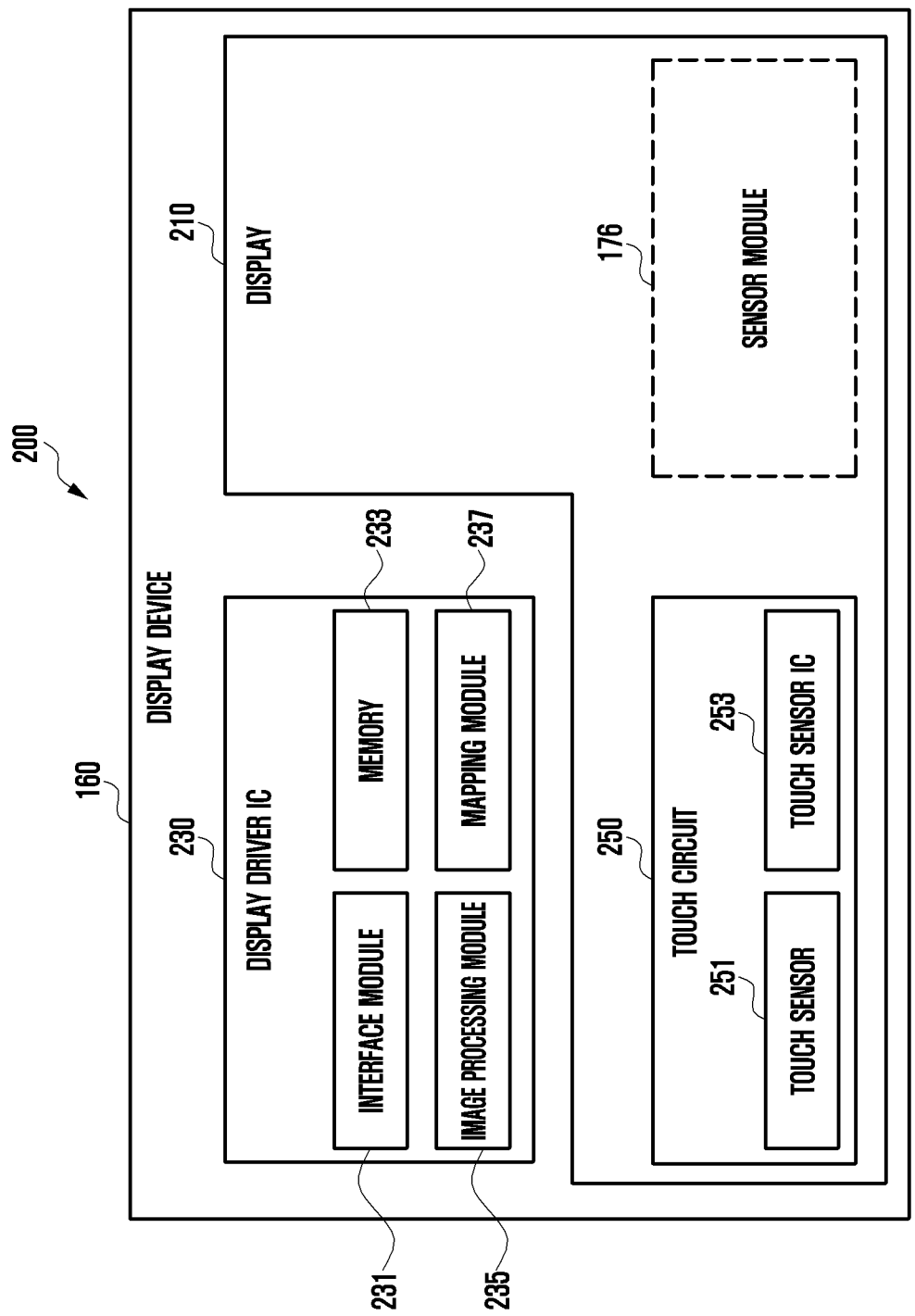
FIG. 2 is a block diagram illustrating the display device according to various embodiments.

FIG. 2 is a block diagram 200 illustrating the display device 160 according to various embodiments.

Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237.

The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 350 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device 101 according to embodiments may be one of various types of electronic devices, such as a portable communication device (e.g., a smartphone), a computer device, a portable multimedia device, a portable medical device, a camera, a wearable device, or a home appliance. However, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., over wires), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
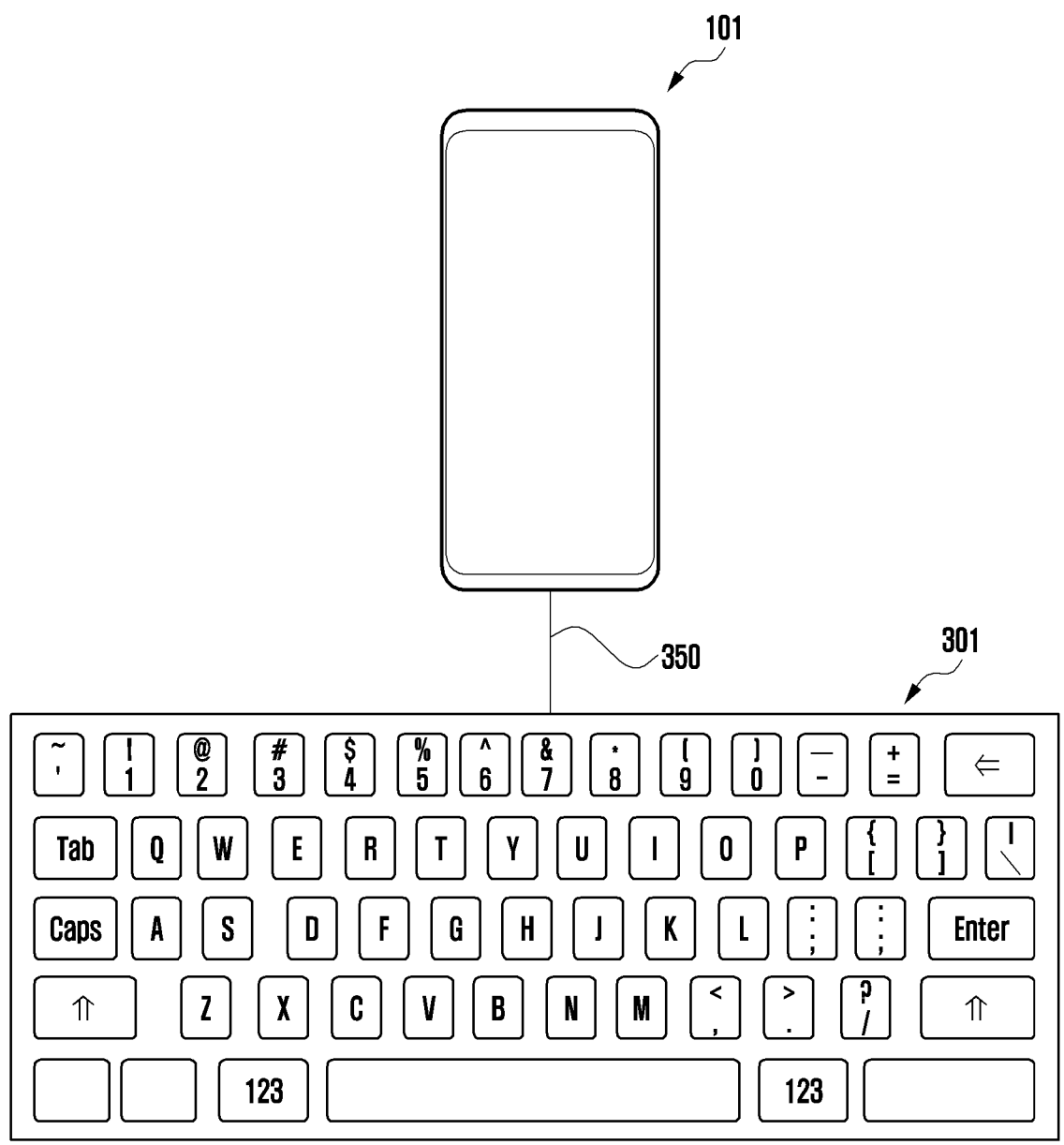
FIG. 3 illustrates an electronic device and an external device according to various embodiments.

FIG. 3 illustrates an electronic device and an external device according to various embodiments.

Referring to FIG. 3, in various embodiments, the electronic device 101 may include a display (e.g., the display 210 of FIG. 2), a housing (or body) in which the display is mounted to be coupled therewith, and an additional device disposed in the housing to perform a function of the electronic device 101. In various embodiments, the additional device may include, for example, a speaker, a microphone, a sensor, a camera, a connection interface (e.g., the interface 177 of FIG. 1, a data input/output port, an audio input/output port, or the like), or a communication interface (e.g., the wireless communication module 192 of FIG. 1). In various embodiments, the electronic device 101 may entirely or partly include, for example, the electronic device 101 of FIG. 1.

In various embodiments, the electronic device 101 may be connected with the external device (e.g., a physical keyboard 301). According to various embodiments, the electronic device 101 may be connected with the external deice 301 based on at least one of various interfaces according to a connection method supported by the external device 301. According to one embodiment, the electronic device 101 may be directly (or via a cable) connected with the external device 301 through the connection interface (e.g., the data input/output port). According to one embodiment, the electronic device 101 may be wirelessly connected with the external device 301 through the communication interface (e.g., the wireless communication module 192 of FIG. 1). For example, connection between the electronic device 101 and the external device 301 indicated by an element 350 in FIG. 3 may represent connection by direct communication or wireless communication.

According to various embodiments, the electronic device 101 may display an object (e.g., guide text) configured in response to connection with the external device 301 through the display. According to various embodiments, the electronic device 101 may display an object (e.g., text) corresponding to an input from the external device 301 through the display.

According to various embodiments, a mounting member (not shown) for mounting the electronic device 101 may be further included between the electronic device 101 and the external device 301, and the electronic device 101 may be electrically connected to the external device 301 through the mounting member. According to one embodiment, the mounting member may be configured to include a mounting pad on which the electronic device 101 can lean to be seated thereon and a connector for electrical connection between the electronic device 101 and the external device 301.

According to various embodiments, the electronic device 101 may be electrically connected with the external device 301 to receive an input signal (e.g., a key value corresponding to a user's key input) from the external device 301.

In various embodiments, the external device 301 may be a physical keyboard (or hardware keyboard). In various embodiments, the external device 301 may include a housing (or body). According to an embodiment, in response to a user's input, the external device 301 may transmit a signal corresponding to the input to the electronic device 101 through the configured communication (e.g., direct communication or wireless communication) indicated by the element 350.

In various embodiments, the external device 301 may include a keyboard of an arbitrary layout or language, for example, a QWERTY, AZERTY, COLEMAK, or Dvorak layout, or may include a modification (e.g., an AZERTY keyboard layout used in France and Belgium) for a different country. In various embodiments, the electronic device 101 may be configured to receive an input corresponding to a layout and language of the external device 301 from the external device 301 (e.g., the physical keyboard).

Figure 4:
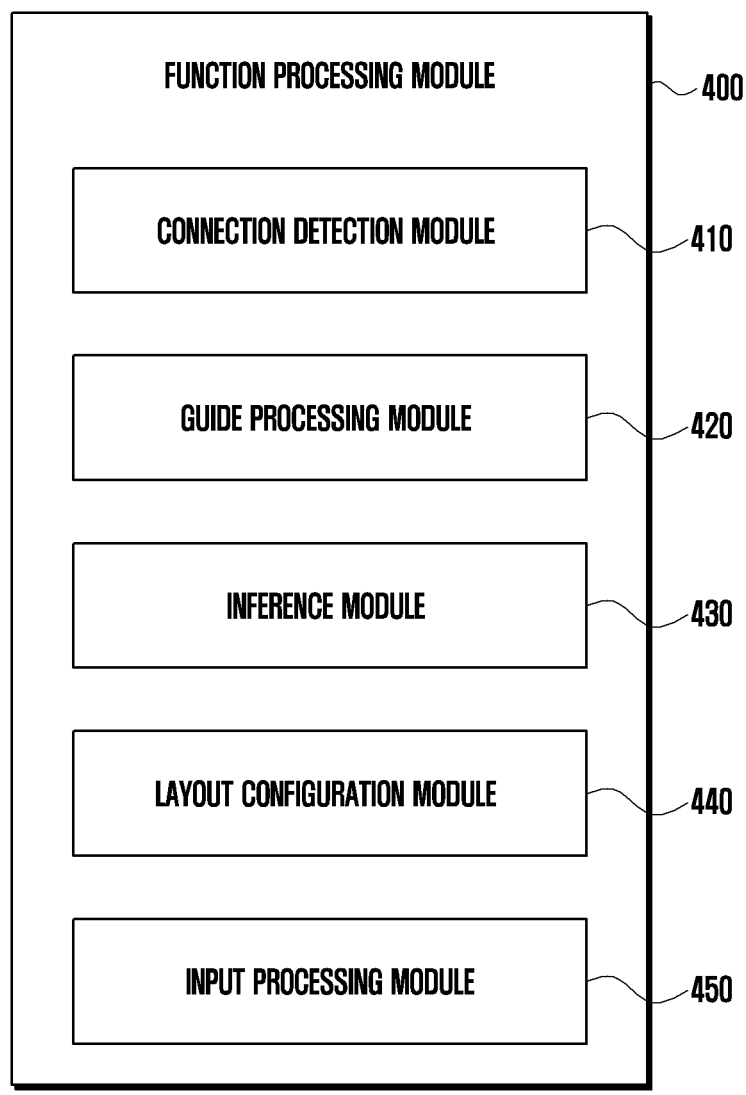
FIG. 4 illustrates an example of a function processing module in an electronic device according to various embodiments.

FIG. 4 illustrates an example of a function processing module in an electronic device according to various embodiments.

FIG. 4 shows an example of a module (e.g., the function processing module 400) of automatically configuring a layout of an external device 301 (e.g., a physical keyboard)

based on interaction with a user to improve user convenience according to various embodiments. For example, FIG. 4 shows an example of the function processing module 400 associated with automatic configuration a keyboard layout matched with a key value input from the external device 301 when guide text is input through the external device 301 connected with the electronic device 101 according to various embodiments. In various embodiments, the function processing module 400 may be included as a hardware module or a software module in a processor (e.g., the processor 120 of FIG. 1) including processing circuitry.

Referring to FIG. 4, the function processing module 400 may include a connection detection module 410, a guide processing module 420, an inference module 430, a layout configuration module 440, and an input processing module 450.

In various embodiments, the connection detection module 410 may detect connection of the external device 301 (e.g., the physical keyboard). According to an embodiment, the connection detection module 410 may detect that the external device 301 is directly (via a cable) connected or wirelessly connected to the electronic device 101. According to an embodiment, upon detecting the connection of the external device 301, the connection detection module 410 may provide a trigger associated with the connection of the external device 301 to the guide processing module 420.

In various embodiments, the guide processing module 420 may output guide text through a display (e.g., the display device 160 of FIG. 1 or 2) of the electronic device 101. According to an embodiment, the guide processing module 420 may output the guide text when the external device 301 is connected to the electronic device 101 (or upon receiving a trigger from the connection detection module 410). In various embodiments, the guide processing module 420 may output the guide text including at least one character. According to an embodiment, the guide text may include a combination of characters configured for a specific word or a combination of characters for a specific word that is generated randomly (or in real time or immediately). For example, the guide text may be provided based on a specific word (e.g., quiz, meeting, human, animal, or the like) that is easily recognizable by the user, thereby minimizing the user's typing errors. Various embodiments are not limited to the foregoing example, and the guide text may be provided, for example, based on at least any one character that may be configured or randomly generated.

In various embodiments, the inference module 430 may infer a keyboard layout that is matched with a signal (e.g., a key value or character corresponding to the user's key input) received from the external device 301 connected to the electronic device 101. According to an embodiment, the inference module 430 may determine at least one signal (e.g., a key value or character) received from the external device 301, may compare the signal with configured layout information, and may infer a layout candidate group including at least one layout candidate matched with the received signal.

According to various embodiments, the electronic device 101 may store a database (DB) of a keyboard layout (e.g., layout information) in a memory (e.g., the memory 130 of FIG. 1). According to an embodiment, the inference module 430 may compare and analyze character data input by the user using the external device 301 based on the database. According to an embodiment, the inference module 430 may determine the coordinates of a character (e.g., quiz) input by the user according to the guide text (e.g., quiz) based on each piece of layout information (e.g., coordinate information per keyboard layout) of the database. According to an embodiment, a first keyboard layout and a second keyboard layout are different layouts, in which the coordinates of, for example, "q", "u", "i", and "z" according to the guide text may be different. The inference module 430 may trace a layout having a key arrangement that is matched with the coordinates corresponding to "quiz" input from the external device 301 among various layouts, which will be described with reference to the following drawings.

In various embodiments, the inference module 430 may determine whether the inferred layout candidate group includes one layout candidate or a plurality of layout candidates. According to an embodiment, when there is one layout candidate, the inference module 430 may determine the layout candidate as a final layout. According to an embodiment, when there is a plurality of layout candidates, the inference module 430 may analyze a character that can be distinguished between the plurality of layout candidates and coordinates thereof.

According to an embodiment, the inference module 430 may provide information about at least one analyzed character (or character data) to the guide processing module 420, and the guide processing module 420 may generate guide text based on the text provided from the inference module 430 and may output the generated guide text through the display. Subsequently, the inference module 430 may infer a keyboard layout that is matched with the signal received from the external device 301 among the plurality of layout candidates, thereby determining a matched final layout. When a plurality of layout candidates is inferred again, the inference module 430 may perform the foregoing process again.

In various embodiments, the layout configuration module 440 may configure a keyboard layout for the connected external device 301 based on the final layout inferred by the inference module 430.

In various embodiments, the input processing module 450 may process an input to a signal received from the external device 301 after configuring the keyboard layout for the external device 301 connected to the electronic device 101. For example, the input processing module 450 may process (e.g., recognize and input) a signal (or key value or character) received in response to a user input from the external device 301 and may display the signal through the display.

As described above, an electronic device 101 according to various embodiments of the disclosure may include: a display (e.g., the display device 160 of FIG. 1 or the display 210 of FIG. 2); a communication interface (e.g., the communication module 190 of FIG. 1 or the interface 177 of FIG. 1); a memory (e.g., the memory 130 of FIG. 1); and a processor (e.g., the processor 120 of FIG. 1 or the function processing module 400 of FIG. 4), wherein the processor 120 may detect connection of an external device (e.g., the external device 301 of FIG. 3 or a physical keyboard) through the communication interface, may display guide text associated with configuration of a keyboard layout on the display upon detecting the connection of the external device, may receive a key value input by a user through the external device, may retrieve a layout corresponding to the received key value, and may configure the retrieved layout as a keyboard layout for the connected external device.

According to various embodiments, the guide text may include a combination of a character configured for a specific word or a combination of characters for a specific word randomly generated.

According to various embodiments, when detecting the connection of the external device, the processor 120 may enter a configuration mode associated with configuration of a keyboard layout and may display the guide text for configuration of a keyboard layout on a pop-up window.

According to various embodiments, the processor 120 may determine a coordinate of the key value received from the external device based on the guide text, may determine an order of the received key value, and may determine a key value of the external device according to the guide text by matching the guide text and the key value.

According to various embodiments, the key value may include an order of key input by the user.

According to various embodiments, when a plurality of layouts corresponding to the key value is retrieved, the processor 120 may analyze distinguishable pieces of keyboard information about the plurality of retrieved layouts, may generate different guide text based on an analysis result, and may display the different guide text on the display.

According to various embodiments, the processor 120 may immediately generate random guide text using a character on at least one key distinguishable between the plurality of layouts.

According to various embodiments, the guide text (e.g., first guide text or default guide text) may include a combination of characters preset and provided as a specific word recognizable by a user, and the different guide text (second guide text or supplementary guide text) may be immediately generated and may include at least one distinguishable character or a combination of distinguishable characters extracted from the plurality of layouts retrieved based on the guide text.

According to various embodiments, when configuration of the keyboard layout is completed, the processor 120 may perform at least one of an operation of outputting a message indicating completion of the configuration or an operation of displaying a virtual keyboard corresponding to the configured keyboard layout on the display.

According to various embodiments, when the key value is not received from the external device, the processor 120 may wait to receive a key value from the external device for a certain time, and may stop configuring a keyboard layout or may generate an alarm for requesting an input using the external device when the certain time expires.

According to various embodiments, when the layout corresponding to the key value is not retrieved, the processor 120 may request the user to re-input guide text.

According to various embodiments, when the layout corresponding to the key value is not retrieved, the processor 120 may update the keyboard layout.

Figure 5:
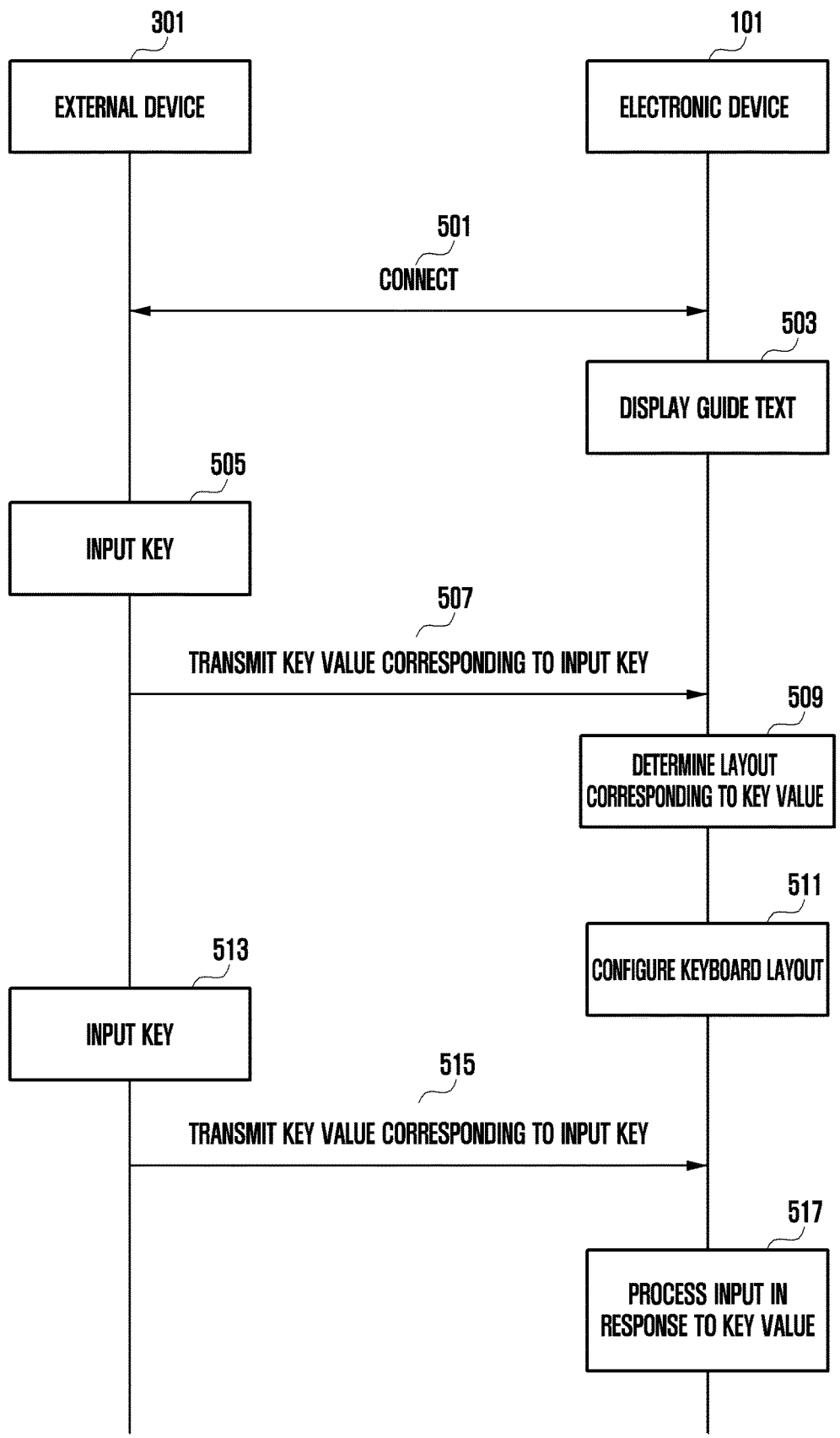
FIG. 5 illustrates an operation between an electronic device and an external device according to various embodiments.

FIG. 5 illustrates an operation between an electronic device and an external device according to various embodiments.

Referring to FIG. 5, in operation 501, the electronic device 101 and the external device 301 (e.g., a physical keyboard) may be connected based on a connection method enabling connection therebetween. According to an embodiment, the electronic device 101 and the external device 301 may be connected by a direct connection (e.g., wired connection) method or a wireless connection method.

In operation 503, the electronic device 101 may display guide text on a display when connected with the external device 301.

In response to a key input by a user in operation 505, the external device 301 may transmit a key value corresponding to the input key to the electronic device 101 in operation 507. For example, the user may identify (or while identifying) the displayed guide text through the electronic device 101 and may directly input a key corresponding to the guide text through the external device 301. According to an embodiment, the external device 301 may transmit the key value corresponding to the key input by the user to the electronic device 101. According to an embodiment, the external device 301 may transmit the key value to the electronic device 101 through a wired interface (e.g., a cable or connector) or a wireless interface (e.g., wireless communication, e.g., Bluetooth communication, NFC, or the like) according to the method for connection with the electronic device 101.

In operation 509, the electronic device 101 may determine a layout corresponding to the key value received from the external device 301. According to an embodiment, the electronic device 101 may compare and analyze character data (e.g., characters and coordinates) input through a user input from the external device 301 based on preset layout information (or layout DB), thereby inferring a layout that matched with the character data.

In operation 511, the electronic device 101 may configure a keyboard layout for the connected external device 301 based on the determined layout.

In response to a key input by the user in operation 513, the external device 301 may transmit a key value corresponding to the input key to the electronic device 101 in operation 515.

In operation 517, the electronic device 101 may process the input in response to the key value. According to an embodiment, the electronic device 101 may display a character corresponding to the key value through the display.

Figure 6:
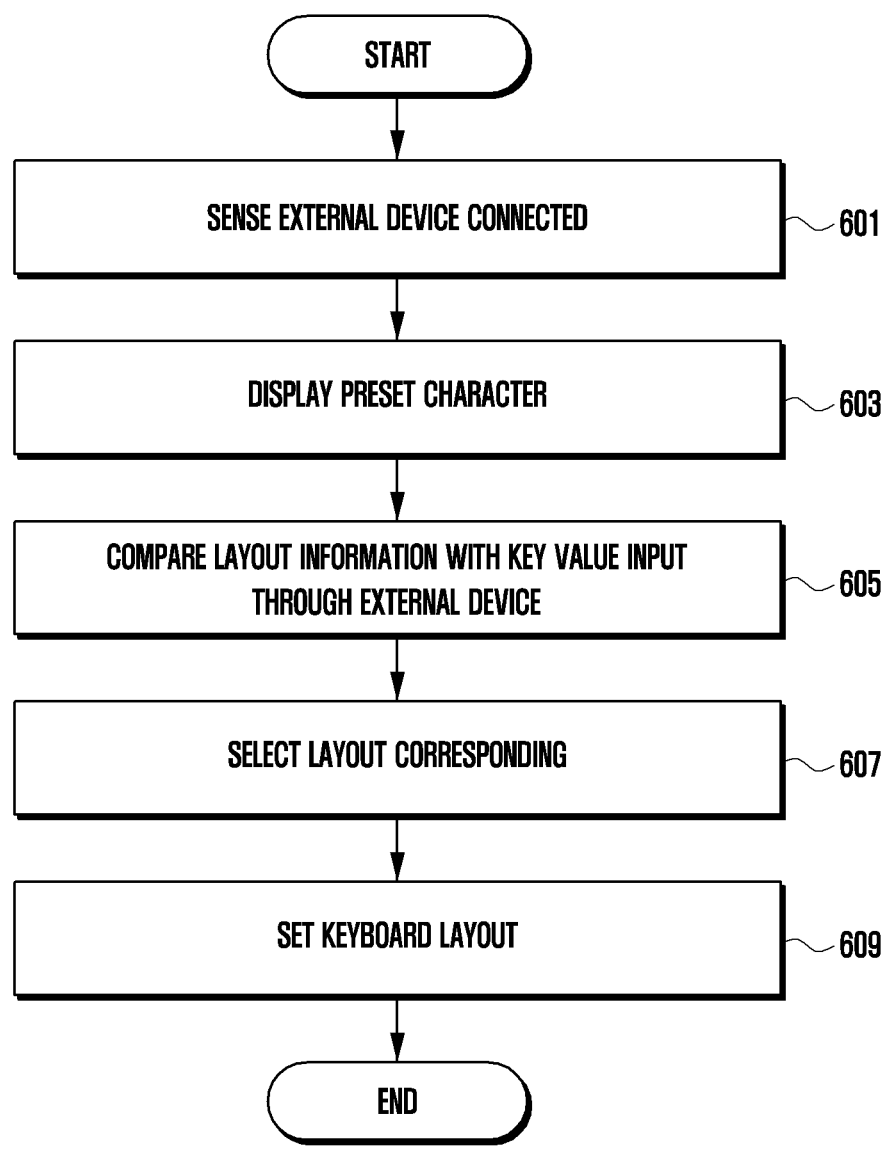
FIG. 6 is a flowchart illustrating an operating method of an electronic device according to various embodiments.

FIG. 6 is a flowchart illustrating an operating method of an electronic device according to various embodiments.

Referring to FIG. 6, in operation 601, a processor 120 (e.g., at least one processor including a processing circuit) (or the function processing module 400 of FIG. 4) of the electronic device 101 may detect connection of an external device 301. According to an embodiment, the processor 120 may detect that the external device 301 is directly connected or wirelessly connected to the electronic device 101.

In operation 603, the processor 120 may display at least one configured character on a display upon detecting the connection of the external device 301. According to an embodiment, the configured character may include guide text. In various embodiments, the guide text may include, for example, a combination of characters configured for a specific word or a combination of characters for a specific word that is generated randomly (or in real time or immediately). For example, the guide text may be provided based on a specific word (e.g., quiz, meeting, human, animal, or the like) that is easily recognizable by the user, thereby minimizing the user's typing errors. Various embodiments are not limited to the foregoing example, and the guide text may be provided, for example, based on at least any one character that may be preconfigured or randomly generated.

In operation 605, the processor 120 may compare a key value input by a user through the external device 301 with layout information. According to an embodiment, the user may identify a character (e.g., quiz) according to the guide text displayed through the electronic device 101 and may input a key corresponding to the identified character to the external device 301. The external device 301 may transmit a key value corresponding to the user input to the electronic device 101 through an interface according to a connection method. According to an embodiment, when receiving the key value through the interface connected to the external device 301, the processor 120 may compare the received key value and preset layout information.

In operation 607, the processor 120 may determine a layout matched with the received key value. According to an embodiment, when receiving the key value from the external device 301, the processor 120 may infer a layout having character data (e.g., characters and coordinates) corresponding to (matched with) the received key value based on layout information about each of various keyboard layouts. According to an embodiment, the processor 120 may determine the matched layout as a keyboard layout of the connected external device 301.

In operation 609, the processor 120 may configure the keyboard layout for the external device 301 based on the determined layout. According to an embodiment, the processor 120 may complete configuration of the keyboard layout and may then process an input from the external device 301.

Figure 7A:
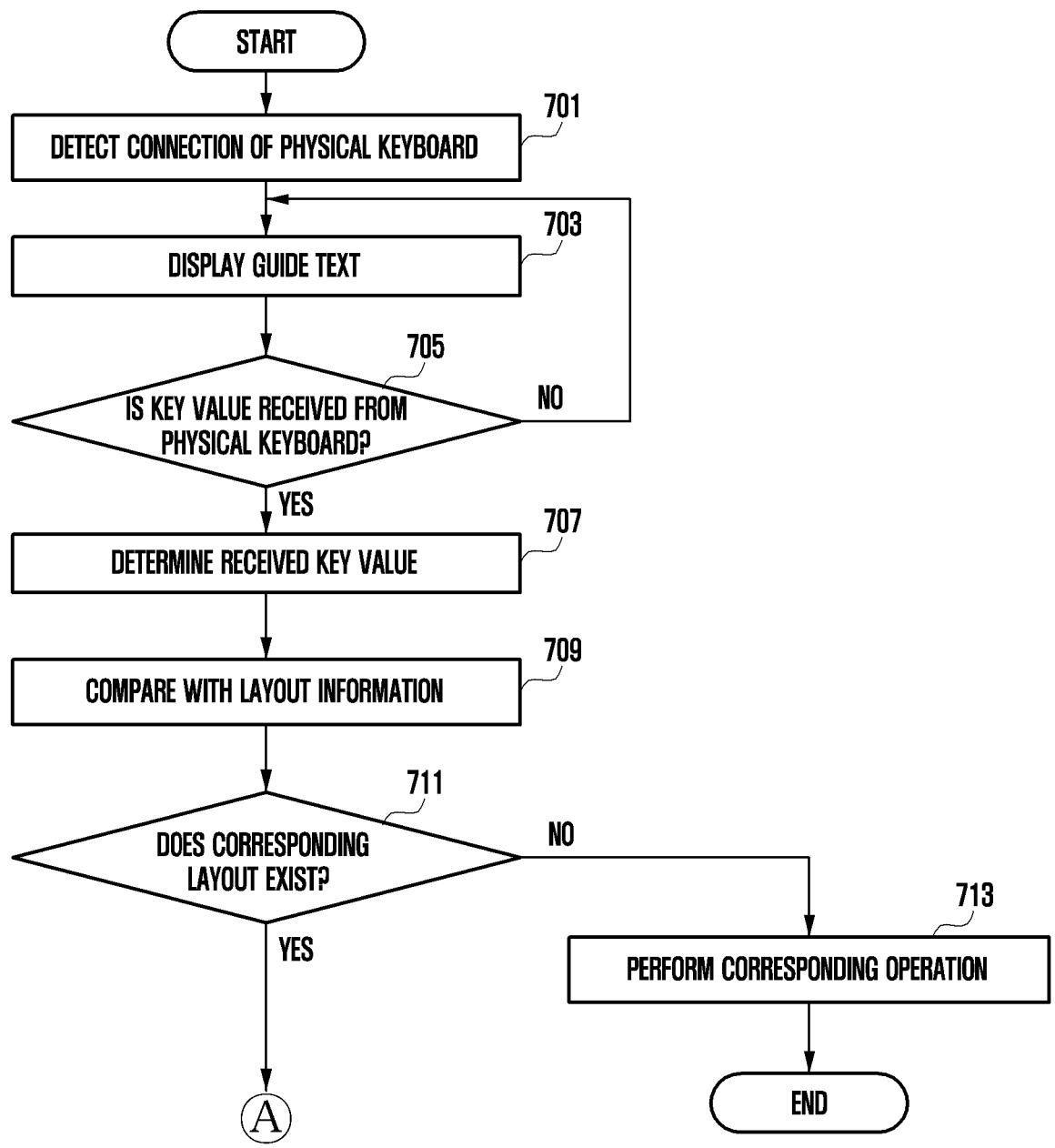
FIG. 7A and FIG. 7B are flowcharts illustrating an operating method of an electronic device according to various embodiments.
Figure 7B:
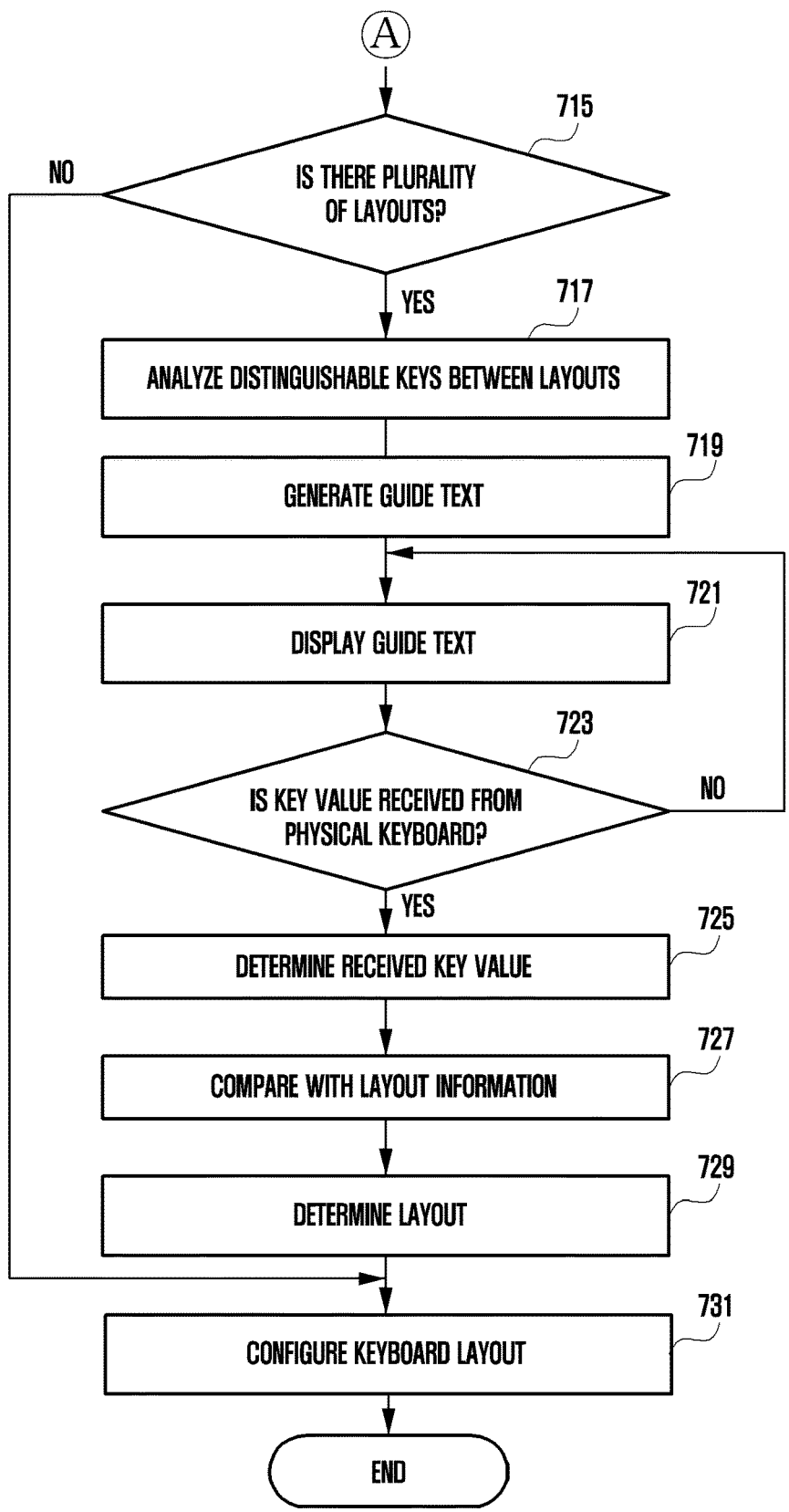

FIG. 7A and FIG. 7B are flowcharts illustrating an operating method of an electronic device according to various embodiments.

Referring to FIG. 7A and FIG. 7B, in operation 701, a processor 120 (e.g., at least one processor including a processing circuit) (or the function processing module 400 of FIG. 4) of the electronic device 101 may detect connection of a physical keyboard (e.g., the external device 301 of FIG. 3).

In operation 703, the processor 120 may display guide text on a display upon detecting the connection of the physical keyboard. According to an embodiment, the processor 120 may enter a configuration mode associated with configuration of a keyboard layout when detecting the connection of the physical keyboard, and may display the guide text for configuration of a keyboard layout on a pop-up window (or related screen interface). A specific example will be described later with reference to FIG. 8.

In operation 705, after displaying the guide text, the processor 120 may determine whether a key value is received from the physical keyboard.

When no key value is received from the physical keyboard in operation 705 ("No" in operation 705), the processor 120 may proceed to operation 703 and may perform operation 703 and subsequent operations. According to an embodiment, after displaying the guide text, the processor 120 may wait to receive a key value from the physical keyboard for a certain time, and may stop configuring a keyboard layout or may generate an alarm for requesting a user to perform an input using the physical keyboard when the certain time expires (e.g., on a timeout). For example, the processor 120 may generate vibrations in a pattern set by the electronic device 101 or may generate a sound (e.g., a voice or warning sound) set by the electronic device 101.

When a key value is received from the physical keyboard in operation 705 ("Yes" in operation 705), the processor 120 may determine the received key value in operation 707. According to various embodiments, the processor 120 may determine the coordinates of the key value received from the physical keyboard based on the guide text. According to an embodiment, the physical keyboard may transmit the key value of an input key to the electronic device 101 in response to a key input by the user, where the key value may include the coordinates of the input key (e.g., q(3-1), u(2-7), i(2-8), and z(2-2)). According to an embodiment, the key value may have an order of the user's key input. For example, the user may sequentially input "q", "u", "i", and "z" on the physical keyboard according to "quiz" of the guide text, and key values may be transmitted to the electronic device 101 in an order in which "q", "u", "i", and "z" are input. According to an embodiment, the processor 120 may determine the order of key values received from the physical keyboard and may match the displayed guide text (e.g., quiz) and the received key values (e.g., coordinates), thereby determining a key value of the physical keyboard according to the guide text.

In operation 709, the processor 120 may compare and analyze layout information using the determined key value. According to various embodiments, the electronic device 101 may store a plurality of keyboard layouts associated with various physical keyboards in a database in a memory (e.g., the memory 130 of FIG. 1). The processor 120 may compare layout information (e.g., a character and coordinates for each key) about each of the plurality of keyboard layouts in the database with the determined key value (e.g., a character and coordinates) and may retrieve (or extract) a matched layout. A specific example will be described later with reference to FIG. 9A, FIG. 9B, FIG. 9C, and FIG. 9D.

In operation 711, the processor 120 may determine whether there is a corresponding layout in the database based on a comparison result.

When no corresponding layout is retrieved in operation 711 ("No" in operation 711), the processor 120 may perform a corresponding operation in operation 713. According to an embodiment, the processor 120 may request the user to re-input the guide text, or may generate and display new guide text on the display and may then request the user to re-input the guide text. According to an embodiment, the processor 120 may perform an operation of updating a layout in the database. For example, the processor 120 may access a server (not shown) to identify update information about a keyboard layout, and may update the keyboard layout by downloading a relevant keyboard layout from the server when updating is needed. According to an embodiment, a case where there is no corresponding layout in the database may include, for example, a case where the user incorrectly inputs a character according to the guide text (e.g., a typing error or an error in the order) or a case where no corresponding layout exists in the database.

When a corresponding layout is retrieved in operation 711 ("Yes" in operation 711), the processor 120 may determine whether a plurality of layouts is retrieved in operation 715. For example, the processor 120 may determine whether one layout is retrieved or a plurality of layouts is retrieved.

When there is one layout in operation 715 ("No" in operation 715), the processor 120 may directly configure a keyboard layout for the physical keyboard based on the corresponding layout in operation 731.

When there is a plurality of layouts in operation 715 ("Yes" in operation 715), the processor 120 may analyze distinguishable pieces of keyboard information (e.g., characters, coordinates, key arrangements, or the like) about the retrieved layouts in operation 717. According to an embodiment, the retrieved layouts may have at least one distinct feature (e.g., a distinguishable (or different) character-printed keyboard), and the processor 120 may extract at least one feature by comparing pieces of layout information about the retrieved layouts. A specific example will be described later with reference to FIG. 10A and FIG. 10B.

In operation 719, the processor 120 may generate guide text based on an analysis result. According to an embodiment, the processor 120 may generate arbitrary guide text using a character on at least one key that can be distinguished in the retrieved layouts. According to an embodiment, the processor 120 may construct the guide text with at least one character or a combination of characters (e.g., random characters) on the at least one key.

In operation 721, the processor 120 may display the guide text on the display. In various embodiments, the guide text (e.g., first guide text) in operation 703 may be different from the guide text (e.g., second guide text) in operation 721. For example, the first guide text may be a combination of characters preset in the electronic device 101 and provided by default as a specific word that the user can easily recognize. For example, the second guide text may include at least one distinguishable character or a combination of distinguishable characters generated immediately (or in real time) and extracted from a plurality of layouts retrieved based on the first guide text. A specific example will be described later with reference to FIG. 11.

In operation 723, the processor 120 may determine whether a key value is received from the physical keyboard after additionally displaying the guide text.

When no key value is received from the physical keyboard in operation 723, the processor 120 may proceed to operation 721 and may perform operation 721 and subsequent operations. According to an embodiment, after displaying the guide text, the processor 120 may wait to receive a key value from the physical keyboard for a certain time, and may stop configuring a keyboard layout or may generate an alarm for requesting the user to perform an input using the physical keyboard when the certain time expires (e.g., on a timeout).

When a key value is received from the physical keyboard in operation 723 ("Yes" in operation 723), the processor 120 may determine the received key value in operation 725. According to an embodiment, operation 725 may include an operation corresponding to that described in operation 707.

In operation 727, the processor 120 may compare and analyze the layout information using the determined key value. According to an embodiment, the processor 120 may compare the layout information (e.g., a character and coordinates for each key) about each of the plurality of retrieved keyboard layouts with the determined key value (e.g., a character and coordinates) and may retrieve (or extract) a matched layout among the plurality of retrieved keyboard layouts.

In operation 729, the processor 120 may determine any one layout corresponding to (or matched with) the key value among the plurality of retrieved keyboard layouts.

In operation 731, the processor 120 may configure a keyboard layout for the physical keyboard based on the determined layout.

According to various embodiments, when completing configuration of the keyboard layout, the processor 120 may perform at least one of an operation of outputting a message indicating completion of the configuration and an operation of displaying a virtual keyboard corresponding to the configured keyboard layout on the display.

Figure 8:
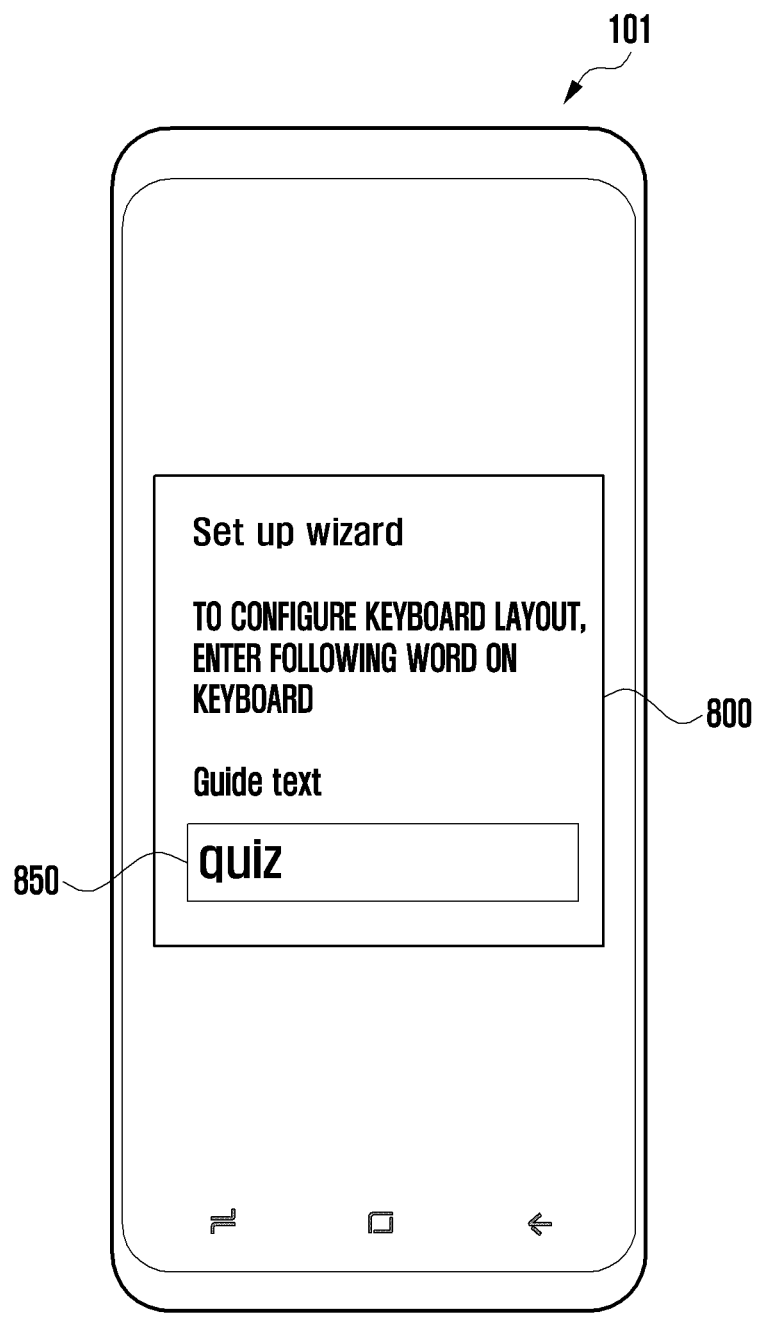
FIG. 8 illustrates an example of a screen displayed by an electronic device according to various embodiments.

FIG. 8 illustrates an example of a screen displayed by an electronic device according to various embodiments.

FIG. 8 shows an example of a user interface providing guide text in the electronic device 101. According to various embodiments, the guide text may be provided through at least one object associated with a guide as to configuration of a keyboard layout for a physical keyboard connected to the electronic device 101. According to an embodiment, the guide text may be provided through a pop-up window 800 for the guide text as illustrated in FIG. 8 and may include a title (e.g., Set up wizard) introducing a menu corresponding to the configuration, a guide message indicating an item to be configured and a configuration method therefor, at least one guide character 850 (e.g., quiz) according to actual guide text to be input through the physical keyboard, or the like. According to an embodiment, the guide message may, for example, guide a user to input a character according to presented guide text using the physical keyboard in order to configure a layout for the physical keyboard.

According to various embodiments, when the guide text is displayed through the electronic device 101, the user may input characters 850 (e.g., quiz) corresponding to the guide text in order on the physical keyboard connected to the electronic device 101. According to an embodiment, the guide text may be provided as a simple word (e.g., quiz, meeting, human, animal, or the like) that is easily recognizable by the user, thereby minimizing the user's typing errors.

According to various embodiments, the physical keyboard may transmit the key value of an input key to the electronic device 101 in response to a key input by the user. In various embodiments, the key value may include the coordinates of the input key (e.g., q(3-1), u(2-7), i(2-8), z(2-2)) as illustrated below in Table 1.

TABLE 1

| Input character | q | u | i | z |
|---|---|---|---|---|
| Input order | 1 | 2 | 3 | 4 |
| Coordinates | 3-1 | 2-7 | 2-8 | 2-2 |

As illustrated in Table 1, the key value by the physical keyboard may have an order of the user's key input. For example, the user may sequentially input "q", "u", "i", and "z" on the physical keyboard according to "quiz" of the guide text, and key values may be transmitted as the coordinates of corresponding keys to the electronic device 101 in an order in which "q", "u", "i", and "z" are input. According to an embodiment, the electronic device 101 may determine the order of key values received from the physical keyboard and may match the displayed guide text (e.g., quiz) and the received key values e.g., coordinates), thereby determining a key value of the physical keyboard according to the guide text.

FIG. 9A, FIG. 9B, FIG. 9C, and FIG. 9D illustrate a layout included in an electronic device according to various embodiments.

Figure 9A:
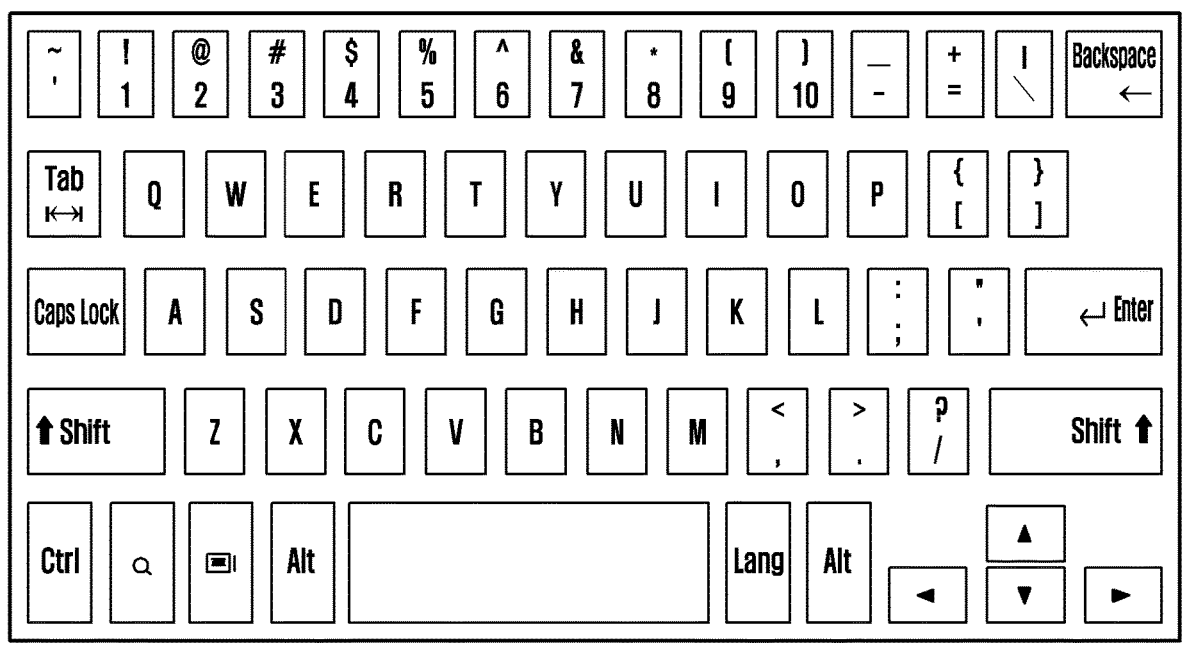
FIG. 9A, FIG. 9B, FIG. 9C, and FIG. 9D illustrate a layout included in an electronic device according to various embodiments.
Figure 9B:
Figure 9C:
Figure 9D:
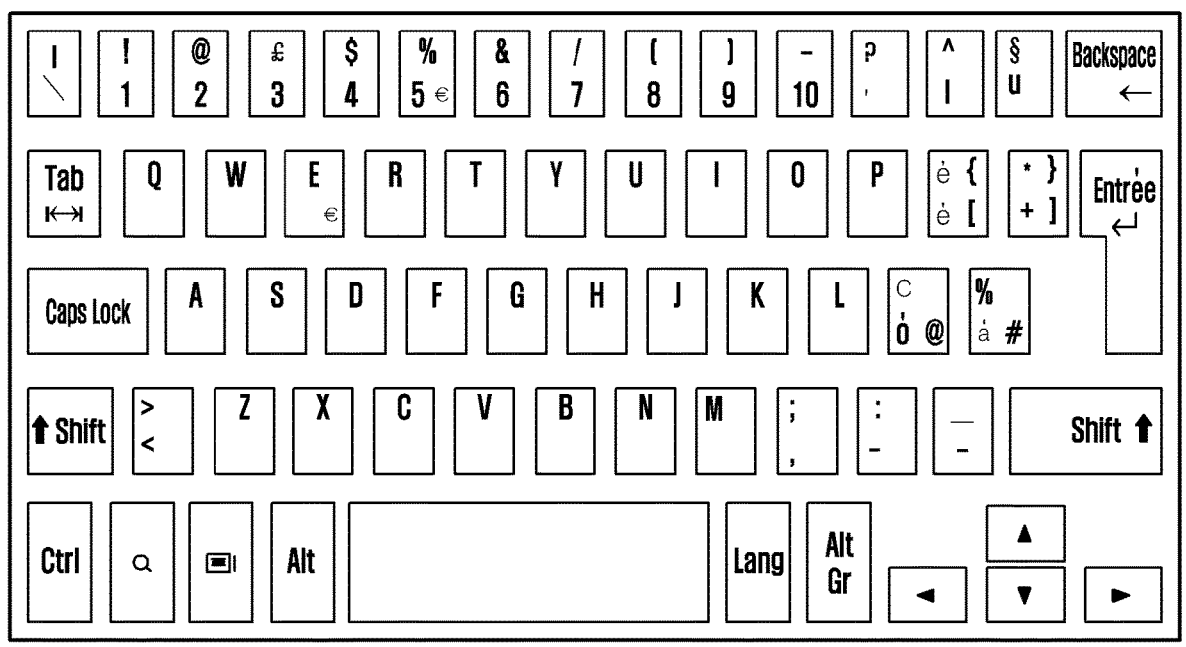

FIG. 9A, FIG. 9B, FIG. 9C, and FIG. 9D show examples of keyboard layouts stored in the electronic device 101. For example, FIG. 9A shows an example of the layout (hereinafter, "first layout") of a physical keyboard having a US English (or QWERTY) key arrangement, FIG. 9B shows an example the layout (hereinafter, "second layout") of a physical keyboard having a French key arrangement, FIG. 9C shows an example of the layout (hereinafter, "third layout") of a physical keyboard having a Belgian key arrangement, and FIG. 9D shows an example of the layout (hereinafter, "fourth layout") of a physical keyboard having a German key arrangement.

According to an embodiment, as illustrated in FIG. 8, a user may input characters 850 (e.g., quiz) corresponding to guide text present by the electronic device 101 using a physical keyboard connected to the electronic device 101. The physical keyboard may transmit a key value corresponding to an input key to the electronic device 101 in response to the input by the user. The electronic device 101 may determine the order of key values received from the physical keyboard and may match the presented guide text (e.g., quiz) and the received key values (e.g., coordinates), thereby determining a key value of the physical keyboard according to the guide text. For example, the electronic device 101 may infer a keyboard layout having a structure corresponding to characters and coordinates matched with the guide text (e.g., quiz) and the key values (e.g., coordinates) from the stored keyboard layouts illustrated in FIG.

9A, FIG. 9B, FIG. 9C, and FIG. 9D. According to an embodiment, as illustrated below in Table 2, the electronic device 101 may compare layout information (e.g., a character and coordinates for each key) about each of the plurality of keyboard layouts with the determined key value (e.g., a character and coordinates) and may retrieve (or extract) a matched layout.

TABLE 2

| Input order | 1 | 2 | 3 | 4 |
|---|---|---|---|---|
| Coordinates | 3-1 | 2-7 | 2-8 | 2-2 |
| First layout (US English) | a | u | i | w |
| Second layout (French) | q | u | i | z |
| Third layout (Belgian) | q | u | i | z |
| Fourth layout (German) | a | u | i | w |

According to an embodiment, key values (e.g., a character and coordinates for each key) actually input by the user on the physical keyboard according to "quiz" of the guide text may be q(3-1), u(2-7), i(2-8), and z(2-2), respectively, and the electronic device 101 may extract keys (or characters) corresponding to the coordinates of (3-1), (2-7), (2-8), and (2-2) from the keyboard layouts.

As illustrated in Table 2, characters corresponding to coordinates input on the physical keyboard and the order thereof may be "auiw" in the first layout, characters corresponding to coordinates input on the physical keyboard and the order thereof may be "quiz" in the second layout, characters corresponding to coordinates input on the physical keyboard and the order thereof may be "quiz" in the third layout, and characters corresponding to coordinates input on the physical keyboard and the order thereof may be "auiw" in the fourth layout.

According to an embodiment, the electronic device 101 may retrieve the second layout and the third layout as layouts corresponding to the key values input from the physical keyboard based on a comparison result. According to an embodiment, the electronic device 101 may infer the retrieved second layout or third layout as a layout associated with the physical keyboard.

According to various embodiments, when a plurality of layouts, such as the second layout and the third layout, corresponding to the key values input from the physical keyboard is retrieved, the electronic device 101 may additionally perform a layout inference operation. A specific example will be described with reference to FIG. 10A and FIG. 10B.

Figure 10A:
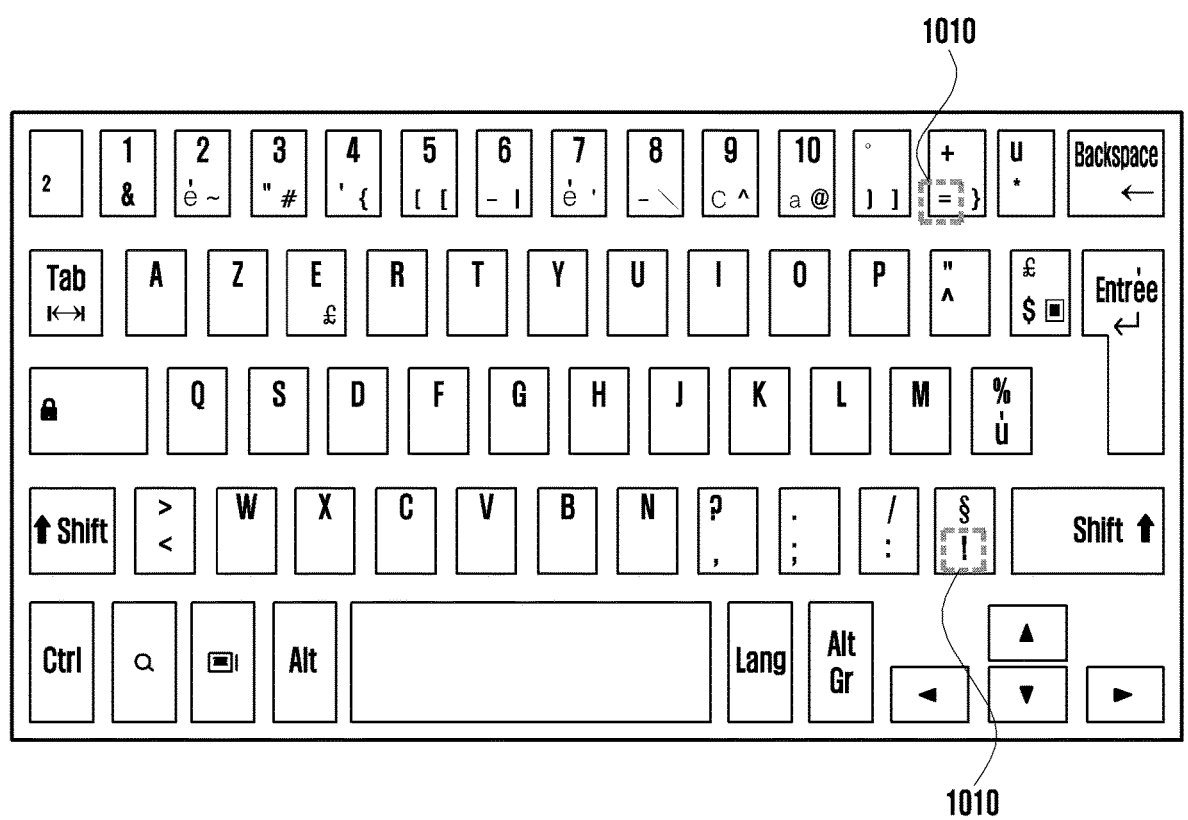
FIG. 10A and FIG. 10B illustrate an example in which an electronic device determines a keyboard layout according to various embodiments.
Figure 10B:
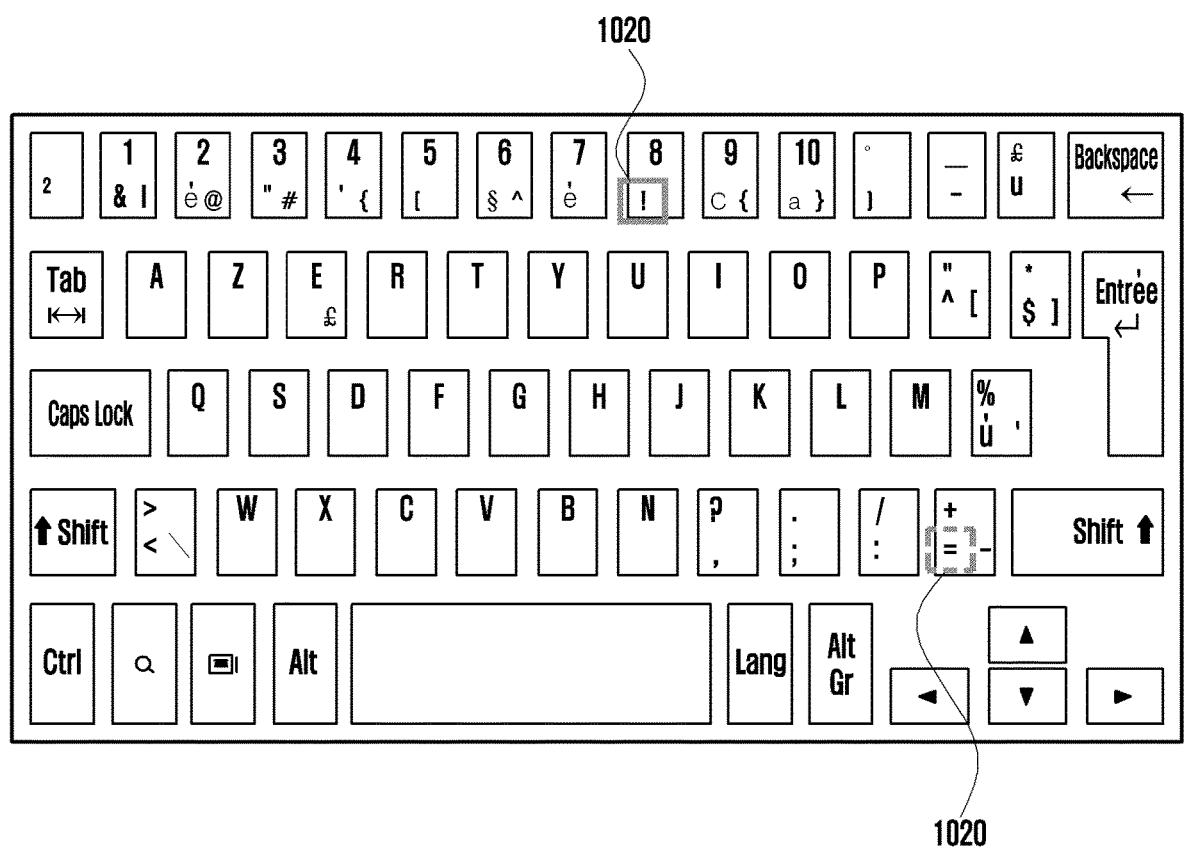

FIG. 10A and FIG. 10B illustrate an example in which an electronic device determines a keyboard layout according to various embodiments.

In FIG. 10A and FIG. 10B, two layouts initially inferred according to FIG. 8 to FIG. 9B (e.g., the second layout and the third layout inferred in FIG. 9A to FIG. 9D) are shown. According to various embodiments, when a plurality of layouts corresponding to a key value input from a physical keyboard is retrieved, the electronic device 101 may analyze distinguishable (or distinct) pieces of keyboard information (e.g., characters, coordinates, key arrangements, or the like) (or features) of the retrieved layouts. According to an embodiment, the layouts may have at least one distinct feature (e.g., a distinguishable (or different) character-printed keyboard), and the electronic device 101 may extract at least one feature by comparing the pieces of layout information about the retrieved layouts.

According to an embodiment, referring to FIG. 10A and FIG. 10B, as illustrated by elements 1010 and 1020, a specific character (e.g., "!", "=", or the like) may be disposed at different positions in the second layout (e.g., FIG. 10A) and the third layout (e.g., FIG. 10B). For example, as illustrated below in Table 3, the coordinates (or positions) of keys with "!" and "=" printed thereon are different in the second layout and the third layout and may be extracted as features.

TABLE 3

| Extracted character | ! | = | ... |
|---|---|---|---|
| Coordinates of character in second layout | 4-11 | 1-12 | ... |
| Coordinates of character in third layout | 1-8 | 4-11 | ... |

According to an embodiment, the electronic device 101 may generate arbitrary guide text using a character (e.g., "!", "=", or the like) on at least one distinguishable key in the retrieved layouts (e.g., the second layout and the third layout). According to an embodiment, a processor 120 may construct the guide text with at least one character or a combination of characters (e.g., random characters) on the at least one key. According to Table 3, the electronic device 101 may configure the guide text using a combination of "!" and "=". The electronic device 101 may construct the guide text by arranging the extracted characters "!" and "=" in a random order.

According to various embodiments, the electronic device 101 may display the additional guide text on the display. A specific example will be illustrated in FIG. 11.

FIG. 11 illustrates an example of a screen displayed by an electronic device according to various embodiments.

FIG. 11 shows an example of a user interface providing guide text in the electronic device 101. FIG. 11 may correspond to the description with reference to FIG. 8. For example, in FIG. 11, the guide text may be provided through a pop-up window 800 and may include a title, a guide message, at least one guide character 1150 according to the guide text, or the like.

According to various embodiments, the guide text (hereinafter, "first guide text") in FIG. 8 and the guide text (hereinafter, "second guide text") in FIG. 11 may be constructed and provided in different manners. According to an embodiment, the first guide text may be a combination of characters (e.g., "quiz" in FIG. 8) preset in the electronic device 101 and provided by default as a specific word that the user can easily recognize. According to an embodiment, the second guide text may be generated immediately (or in real time) when a plurality of layouts is inferred according to the first guide text. According to an embodiment, the second guide text may include at least one distinguishable character or a combination of distinguishable characters (e.g., "!=" in FIG. 11) extracted from the plurality of layouts retrieved based on the first guide text.

According to various embodiments, when the guide text is displayed again through the electronic device 101, a user may input characters 1150 (e.g., ! and =) corresponding to the guide text in order on a physical keyboard connected to the electronic device 101.

According to various embodiments, the physical keyboard may transmit the key value of an input key to the electronic device 101 in response to a key input by the user. In various embodiments, as illustrated below in Table 5, the key value may include the coordinates of the input key (e.g., !(4-11) and =(1-12)).

TABLE 4

| Input order | 1 | 2 | ... |
|---|---|---|---|
| Coordinates | 4-11 | 1-12 | ... |
| Second layout French | ! | = | ... |
| Third layout Belgian | = | — | ... |

As illustrated in Table 4, the key value by the physical keyboard may have an order of the user's key input. For example, the user may sequentially input "!" and "=" on the physical keyboard according to "!=" of the guide text, and key values may be transmitted as the coordinates of corresponding keys to the electronic device 101 in an order in which "!" and "=" are input. According to an embodiment, the electronic device 101 may determine the order of key values received from the physical keyboard and may match the displayed guide text (e.g., !=) and the received key values e.g., coordinates), thereby determining a key value of the physical keyboard according to the guide text.

According to an embodiment, the electronic device 101 may determine a keyboard layout having a structure corresponding to characters and coordinates matched with the guide text (e.g., !=) and the key values (e.g., coordinates) among inferred keyboard layouts as illustrated in FIGS. 10A and 10B. According to an embodiment, as illustrated in Table 4, the electronic device 101 may compare layout information (e.g., a character and coordinates for each key) about each of the plurality of keyboard layouts with the determined key value (e.g., a character and coordinates) and may retrieve (or extract) a matched layout. According to an embodiment, key values (e.g., a character and coordinates for each key) actually input by the user on the physical keyboard according to "!=" of the guide text may be !(4-11) and =(1-12), respectively, and the electronic device 101 may extract keys (or characters) corresponding to the coordinates of ((4-11) and (1-12) from the keyboard layouts.

As illustrated in Table 4, characters corresponding to coordinates input on the physical keyboard and the order thereof may be "!=" in the second layout, and characters corresponding to coordinates input on the physical keyboard and the order thereof may be "=-" in the third layout. According to an embodiment, the electronic device 101 may extract the second layout as a layout corresponding to the key values input from the physical keyboard based on a comparison result and may determine the extracted second layout as a final layout associated with the physical keyboard.

According to various embodiments, the electronic device 101 may process a layout inference operation in the background and may not actually display the inference operation to the user. According to an embodiment, the electronic device 101 may display the first guide text (e.g., guide characters "quiz") of FIG. 8 to the user through the pop-up window 800, may internally process the inference operation, and may then display only the changed second guide text (e.g., guide characters "!=") with the pop-up window 800 maintained when a plurality of layouts is inferred. According to an embodiment, when providing the second guide text, the electronic device 101 may provide a guide message further including a message requesting an additional input from the user.

As described above, an operating method of an electronic device 101 according to various embodiments of the disclosure may include: detecting connection of an external device through a communication interface; displaying guide text associated with configuration of a keyboard layout on a display upon detecting the connection of the external device; receiving a key value input by a user through the external device; retrieving a layout corresponding to the received key value; and configuring the retrieved layout as a keyboard layout for the connected external device.

According to various embodiments, the guide text may include a combination of characters configured for a specific word or a combination of characters for a specific word randomly generated.

According to various embodiments, the displaying may include entering a configuration mode associated with configuration of a keyboard layout and displaying the guide text for configuration of a keyboard layout on a pop-up window.

According to various embodiments, the retrieving may include determining a coordinate of the key value received from the external device based on the guide text, determining an order of the received key value, and determining a key value of the external according to the guide text by matching the guide text and the key value.

According to various embodiments, the key value may include an order of key input by the user.

According to various embodiments, when a plurality of layouts corresponding to the key value is retrieved, the method may include analyzing distinguishable pieces of keyboard information about the plurality of retrieved layouts, generating different guide text based on an analysis result, and displaying the different guide text on the display.

According to various embodiments, the generating may include immediately generating random guide text using a character on at least one key distinguishable between the plurality of layouts.

According to various embodiments, the guide text may include a combination of characters preset and provided as a specific word recognizable by a user, and the different guide text may be immediately generated and may include at least one distinguishable character or a combination of distinguishable characters extracted from the plurality of layouts retrieved based on the guide text.

Various embodiments of the disclosure disclosed in the specification and drawings are merely to provide specific examples in order to easily describe the technical content of the disclosure and to assist understanding of the disclosure and are not intended to limit the scope of the disclosure. Therefore, the scope of the disclosure should be interpreted to include all changes or modifications derived based on the technical idea of the disclosure in addition to the embodiments disclosed herein.

The invention claimed is:

1. An electronic device comprising:
a display;
a communication interface;
a memory; and
a processor, wherein the processor is configured to:
   detect connection of an external device through the communication interface,
   display guide text associated with configuration of a keyboard layout on the display upon detecting the connection of the external device,
   receive a key value input, corresponding to the guide text, by a user through the external device,
   retrieve a layout corresponding to the received key value, and configure the retrieved layout as a keyboard layout for the connected external device.

2. The electronic device as claimed in claim 1, wherein the guide text comprises a combination of a character configured for a specific word or a combination of a character for a specific word randomly generated.

3. The electronic device as claimed in claim 2, wherein, when detecting the connection of the external device, the processor is configured to enter a configuration mode associated with configuration of a keyboard layout and to display the guide text for configuration of a keyboard layout on a pop-up window.

4. The electronic device as claimed in claim 2, wherein the processor is configured to determine a coordinate of the key value received from the external device based on the guide text, to determine an order of the received key value, and to determine a key value of the external device according to the guide text by matching the guide text and the key value.

5. The electronic device as claimed in claim 4, wherein the key value comprises an order of key input by the user.

6. The electronic device as claimed in claim 2, wherein, when a plurality of layouts corresponding to the key value is retrieved, the processor is configured to analyze distinguishable pieces of keyboard information about the plurality of retrieved layouts, to generate different guide text based on an analysis result, and to display the different guide text on the display.

7. The electronic device as claimed in claim 6, wherein the processor is configured to immediately generate random guide text using a character on at least one key distinguishable between the plurality of layouts.

8. The electronic device as claimed in claim 6, wherein the guide text comprises a combination of a character preset and provided as a specific word recognizable by a user, and
  the different guide text is immediately generated and comprises at least one distinguishable character or a combination of a distinguishable character extracted from the plurality of layouts retrieved based on the guide text.

9. The electronic device as claimed in claim 2, wherein, when configuration of the keyboard layout is completed, the processor is configured to perform at least one of an operation of outputting a message indicating completion of the configuration or an operation of displaying a virtual keyboard corresponding to the configured keyboard layout on the display.

10. The electronic device as claimed in claim 2, wherein, when the key value is not received from the external device, the processor is configured to wait to receive a key value from the external device for a certain time, and to stop configuring a keyboard layout or to generate an alarm for requesting an input using the external device when the certain time expires.

11. The electronic device as claimed in claim 2, wherein, when the layout corresponding to the key value is not retrieved, the processor is configured to request the user to re-input guide text.

12. The electronic device as claimed in claim 2, wherein, when the layout corresponding to the key value is not retrieved, the processor is configured to update the keyboard layout.

13. An operating method of an electronic device, the method comprising:
  detecting connection of an external device through a communication interface;
  displaying guide text associated with configuration of a keyboard layout on a display upon detecting the connection of the external device;
  receiving an input of a key value, corresponding to the guide text, by a user through the external device;
  retrieving a layout corresponding to the received key value; and
  configuring the retrieved layout as a keyboard layout for the connected external device.

14. The method as claimed in claim 13, wherein the retrieving comprises determining a coordinate of the key value received from the external device based on the guide text, determining an order of the received key value, and determining a key value of the external device according to the guide text by matching the guide text and the key value, and
  the key value comprises an order of key input by the user.

15. The method as claimed in claim 13, wherein, when a plurality of layouts corresponding to the key value is retrieved, the method comprises analyzing distinguishable pieces of keyboard information about the plurality of retrieved layouts, generating different guide text based on an analysis result, and displaying the different guide text on the display,
  the guide text comprises a combination of a character preset and provided as a specific word recognizable by a user, and
  the different guide text is immediately generated and comprises at least one distinguishable character or a combination of a distinguishable character extracted from the plurality of layouts retrieved based on the guide text.

* * * * *